US010879606B2

(12) United States Patent
Ruaro et al.

(10) Patent No.: US 10,879,606 B2
(45) Date of Patent: Dec. 29, 2020

(54) ELECTRONIC DEVICE SLOT ANTENNAS

(71) Applicant: Apple Inc., Cupertino, CA (US)

(72) Inventors: Andrea Ruaro, Campbell, CA (US); Carlo Di Nallo, Belmont, CA (US); Eduardo Jorge Da Costa Bras Lima, Sunnyvale, CA (US); Jayesh Nath, Milpitas, CA (US); Mario Martinis, Cupertino, CA (US); Mattia Pascolini, San Francisco, CA (US); Zheyu Wang, Sunnyvale, CA (US); Sameer Pandya, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/854,774

(22) Filed: Apr. 21, 2020

(65) Prior Publication Data

US 2020/0251820 A1 Aug. 6, 2020

Related U.S. Application Data

(63) Continuation of application No. 15/698,481, filed on Sep. 7, 2017, now Pat. No. 10,658,749.

(51) Int. Cl.
*H01Q 1/44* (2006.01)
*H01Q 1/52* (2006.01)
(Continued)

(52) U.S. Cl.
CPC ........... *H01Q 1/528* (2013.01); *H01Q 1/2266* (2013.01); *H01Q 1/24* (2013.01); *H01Q 1/243* (2013.01);
(Continued)

(58) Field of Classification Search
CPC ........ H01Q 1/528; H01Q 1/243; H01Q 1/273; H01Q 9/04; H01Q 1/2266; H01Q 13/16; H01Q 1/44; H01Q 1/52; H01Q 1/24
(Continued)

(56) References Cited

U.S. PATENT DOCUMENTS 8,269,675 B2 9/2012 Kough et al.
8,493,274 B2 7/2013 Raura
(Continued)

FOREIGN PATENT DOCUMENTS

CN 104009279 A 8/2014
CN 104638361 A 5/2015
(Continued)

*Primary Examiner* — Hai V Tran
(74) *Attorney, Agent, or Firm* — Treyz Law Group, P.C.; Michael H. Lyons

(57) ABSTRACT

An electronic device such as a wristwatch may have a housing with metal sidewalls and a display having conductive display structures. Printed circuits having corresponding ground traces may be coupled to the display for conveying data to and/or from the display. The conductive display structures may be separated from the metal sidewalls by a gap. A conductive interconnect may be coupled to the metal sidewalls and may extend across the gap to the conductive display structures. The conductive interconnect may be coupled to the ground traces on the printed circuits and/or may be shorted or capacitively coupled to the conductive display structures. When configured in this way, the metal sidewalls, the conductive display structures, and the conductive interconnect may define the edges of a slot antenna resonating element for a slot antenna.

20 Claims, 13 Drawing Sheets

(51) Int. Cl.

| | |
|---|---|
| ***H01Q 1/24*** | (2006.01) |
| ***H01Q 9/04*** | (2006.01) |
| ***H01Q 1/22*** | (2006.01) |
| ***H01Q 1/27*** | (2006.01) |
| ***H01Q 13/16*** | (2006.01) |

(52) U.S. Cl.
CPC ............... *H01Q 1/273* (2013.01); *H01Q 1/44* (2013.01); *H01Q 1/52* (2013.01); *H01Q 9/04* (2013.01); *H01Q 13/16* (2013.01)

(58) Field of Classification Search
USPC .......................................................... 343/718
See application file for complete search history.

(56) References Cited

U.S. PATENT DOCUMENTS

| | | | | |
|---|---|---|---|---|
| 9,065,175 | B2 | 6/2015 | Corbin et al. | |
| 9,627,769 | B2 | 4/2017 | Koo et al. | |
| 2003/0189522 | A1 | 10/2003 | Zeilinger | |
| 2012/0299785 | A1* | 11/2012 | Bevelacqua | H01Q 5/328 343/702 |
| 2013/0009833 | A1 | 1/2013 | Kough et al. | |
| 2013/0082984 | A1* | 4/2013 | Drzaic | H05K 1/189 345/204 |
| 2013/0107476 | A1* | 5/2013 | Wright | H05K 1/115 361/752 |
| 2014/0240176 | A1* | 8/2014 | Tolbert | H01Q 1/52 343/702 |
| 2014/0323063 | A1* | 10/2014 | Xu | H01Q 9/0442 455/77 |
| 2014/0329558 | A1* | 11/2014 | Darnell | H04B 1/0458 455/553.1 |
| 2015/0280771 | A1 | 10/2015 | Mow et al. | |
| 2015/0351292 | A1 | 12/2015 | Chang et al. | |
| 2016/0248148 | A1 | 8/2016 | Hill et al. | |
| 2016/0309007 | A1 | 10/2016 | Irci et al. | |
| 2017/0077603 | A1 | 3/2017 | Krogerus et al. | |

FOREIGN PATENT DOCUMENTS

| | | | |
|---|---|---|---|
| CN | 204539638 | U | 8/2015 |
| WO | 2006120250 | A2 | 11/2006 |

* cited by examiner

ELECTRONIC DEVICE SLOT ANTENNAS

This application is a continuation of patent application Ser. No. 15/698,481, filed on Sep. 7, 2017, which is hereby incorporated by reference herein in its entirety.

BACKGROUND

This relates to electronic devices, and more particularly, to antennas for electronic devices with wireless communications circuitry.

Electronic devices are often provided with wireless communications capabilities. To satisfy consumer demand for small form factor wireless devices, manufacturers are continually striving to implement wireless communications circuitry such as antenna components using compact structures. At the same time, there is a desire for wireless devices to cover a growing number of communications bands.

Because antennas have the potential to interfere with each other and with components in a wireless device, care must be taken when incorporating antennas into an electronic device. Moreover, care must be taken to ensure that the antennas and wireless circuitry in a device are able to exhibit satisfactory performance over a range of operating frequencies.

It would therefore be desirable to be able to provide improved wireless communications circuitry for wireless electronic devices.

SUMMARY

An electronic device such as a wristwatch may have a housing with metal portions such as metal sidewalls. A display may be mounted on a front face of the device. The display may include a display module with conductive display structures and a display cover layer that overlaps the display module. The conductive display structures may include portions of a touch sensor layer, portions of a display layer that displays images, portions of a near field communications antenna layer, a metal frame for the display module, a metal back plate for the display module, or other conductive structures. Printed circuits having corresponding ground traces may be coupled to the display module for conveying data to and/or from the display module (e.g., touch sensor data, near field communications data, image data, etc.).

The electronic device may include wireless communications circuitry. The wireless communications circuitry may include radio-frequency transceiver circuitry and an antenna such as a slot antenna. The conductive display structures may be separated from the metal sidewalls by a gap that runs around the display module. The slot antenna may be fed using an antenna feed having a positive feed terminal coupled to the conductive display structures and a ground feed terminal coupled to the metal sidewalls.

A conductive interconnect may be coupled to the metal sidewalls (e.g., using a conductive fastener) and may extend across the gap to the display module. The conductive interconnect may be shorted to the conductive display structures in the display module or may be capacitively coupled to the conductive display structures in the display module. If desired, the conductive interconnect may be shorted to the ground traces on the printed circuits coupled to the display module (e.g., without being capacitively coupled or shorted to the conductive display structures). When configured in this way, the metal sidewalls, the conductive display structures, and the conductive interconnect may define the edges of a slot element (e.g., a slot antenna resonating element) for the slot antenna. The perimeter of the slot element (e.g., as defined by the metal sidewalls, the conductive display structures, and the conductive interconnect) may support coverage in one or more frequency bands. The presence of the grounded conductive interconnect may serve to define part of the slot element while mitigating excessively strong electric fields within the gap, thereby improving antenna efficiency relative to scenarios where the conductive interconnect is absent from the electronic device.

DETAILED DESCRIPTION

Figure 1:
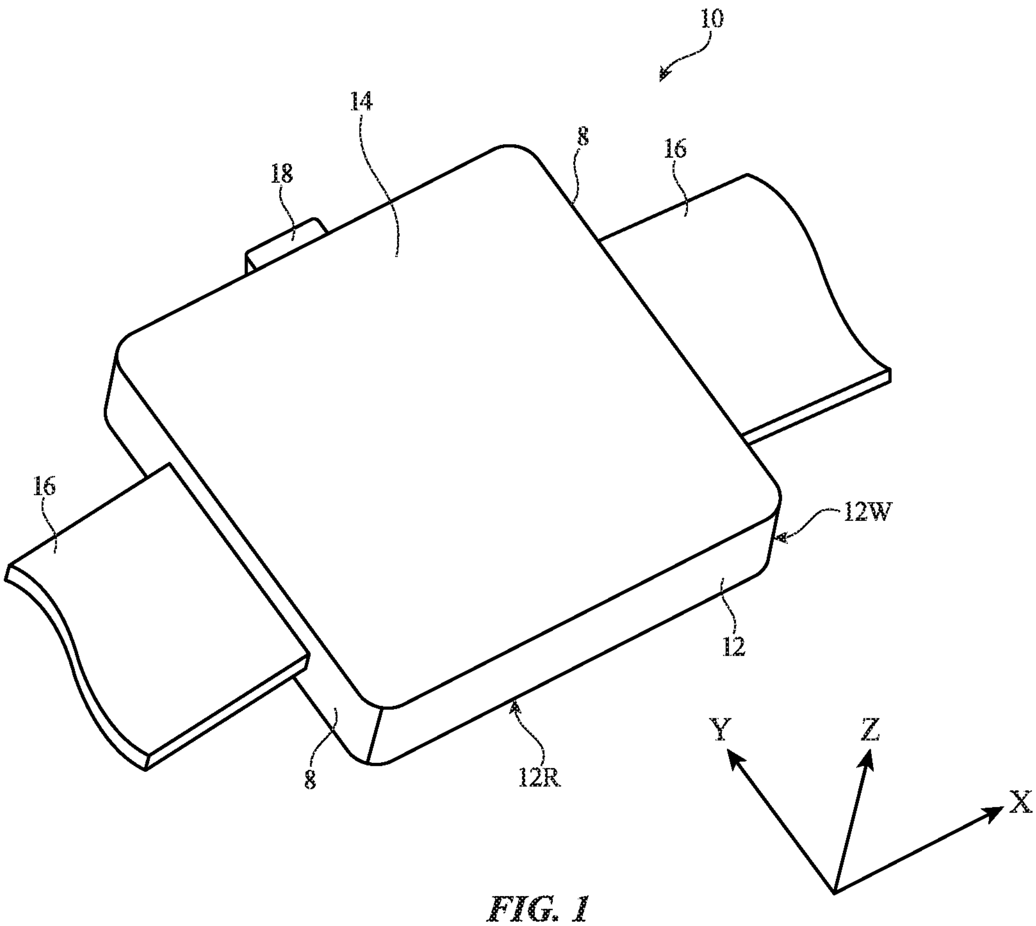
FIG. 1 is a front perspective view of an illustrative electronic device in accordance with an embodiment.

An electronic device such as electronic device 10 of FIG. 1 may be provided with wireless circuitry. The wireless circuitry may include antennas. Antennas such as cellular telephone antennas and wireless local area network and satellite navigation system antennas may be formed from electrical components such as displays, touch sensors, near-field communications antennas, wireless power coils, peripheral antenna resonating elements, and device housing structures.

Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a wristwatch. Other configurations may be used for device 10 if desired. The example of FIG. 1 is merely illustrative.

In the example of FIG. 1, device 10 includes a display such as display 14. Display 14 may be mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Housing 12 may have metal sidewall structures such as sidewalls 12W or sidewalls formed from other materials. Examples of metal materials that may be used for forming sidewalls 12W include stainless steel, aluminum, silver, gold, metal alloys, or any other desired conductive material. Housing 12 may, for example, have a substantially rectangular periphery (e.g., defined by four sidewall structures 12W that meet at perpendicular or rounded corners), rounded shapes, or other shapes.

Display 14 may be formed at the front side (face) of device 10. Housing 12 may have a rear housing wall such as rear wall 12R that opposes front face of device 10. Housing sidewalls 12W may surround the periphery of device 10 (e.g., housing sidewalls 12W may extend around peripheral edges of device 10). Rear housing wall 12R may be formed from conductive materials and/or dielectric materials. Examples of dielectric materials that may be used for forming rear housing wall 12R include plastic, glass, sapphire, ceramic, wood, polymer, combinations of these materials, or any other desired dielectrics. Rear housing wall 12R and/or display 14 may extend across some or all of the length (e.g., parallel to the X-axis of FIG. 1) and width (e.g., parallel to the Y-axis) of device 10. Housing sidewalls 12W may extend across some or all of the height of device 10 (e.g., parallel to Z-axis). Housing sidewalls 12W and/or the rear wall 12R of housing 12 may form one or more exterior surfaces of device 10 (e.g., surfaces that are visible to a user of device 10) and/or may be implemented using internal structures that do not form exterior surfaces of device 10 (e.g., conductive or dielectric housing structures that are not visible to a user of device 10 such as conductive structures that are covered with layers such as thin cosmetic layers, protective coatings, and/or other coating layers that may include dielectric materials such as glass, ceramic, plastic, or other structures that form the exterior surfaces of device 10 and/or serve to hide structures 12R and/or 12W from view of the user).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies.

Display 14 may be protected using a display cover layer. The display cover layer may be formed from a transparent material such as glass, plastic, sapphire or other crystalline dielectric materials, ceramic, or other clear materials. The display cover layer may extend across substantially all of the length and width of device 10, for example.

Device 10 may include buttons such as button 18. There may be any suitable number of buttons in device 10 (e.g., a single button, more than one button, two or more buttons, five or more buttons, etc. Buttons may be located in openings in housing 12 (e.g., in side wall 12W or rear wall 12R) or in an opening in display 14 (as examples). Buttons may be rotary buttons, sliding buttons, buttons that are actuated by pressing on a movable button member, etc. Button members for buttons such as button 18 may be formed from metal, glass, plastic, or other materials. Button 18 may sometimes be referred to as a crown in scenarios where device 10 is a wristwatch device.

Device 10 may, if desired, be coupled to a strap such as strap 16. Strap 16 may be used to hold device 10 against a user's wrist (as an example). In the example of FIG. 1, strap 16 is connected to opposing sides 8 of device 10. Housing walls 12W on sides 8 of device 10 may include attachment structures for securing strap 16 to housing 12 (e.g., lugs or other attachment mechanisms). Configurations that do not include straps may also be used for device 10.

Figure 2:
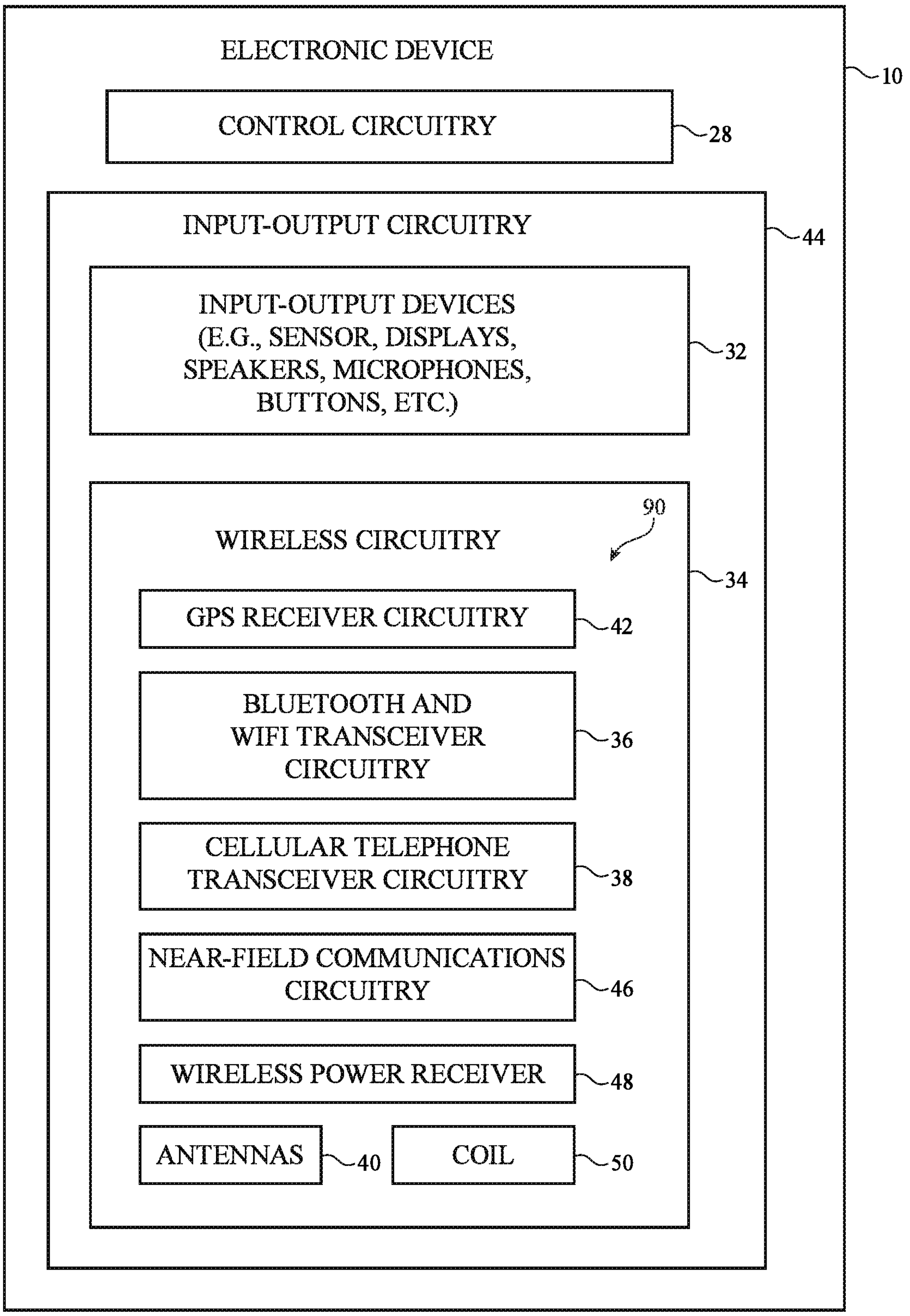
FIG. 2 is a schematic diagram of an illustrative electronic device in accordance with an embodiment.

A schematic diagram showing illustrative components that may be used in device 10 is shown in FIG. 2. As shown in FIG. 2, device 10 may include control circuitry such as storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, voice-over-internet-protocol (VOIP) telephone call applications, email applications, media playback applications, operating system functions, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, MIMO protocols, antenna diversity protocols, etc.

Input-output circuitry 44 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices 32 may include touch screens, displays without touch sensor capabilities, buttons, scrolling wheels, touch pads, key pads, keyboards, microphones, cameras, buttons, speakers, status indicators, light sources, audio jacks and other audio port components, digital data port devices, light sensors, light-emitting diodes, motion sensors (accelerometers), capacitance sensors, proximity sensors, magnetic sensors, force sensors (e.g., force sensors coupled to a display to detect pressure applied to the display), etc.

Input-output circuitry 44 may include wireless circuitry 34. Wireless circuitry 34 may include coil 50 and wireless power receiver 48 for receiving wirelessly transmitted power from a wireless power adapter. To support wireless communications, wireless circuitry 34 may include radio-frequency (RF) transceiver circuitry formed from one or more integrated circuits, power amplifier circuitry, low-noise input amplifiers, passive RF components, one or more antennas such as antennas 40, transmission lines, and other circuitry for handling RF wireless signals. Wireless signals can also be sent using light (e.g., using infrared communications).

Wireless circuitry 34 may include radio-frequency transceiver circuitry 90 for handling various radio-frequency communications bands. For example, circuitry 34 may include transceiver circuitry 36, 38, 42, and 46. Transceiver circuitry 36 may be wireless local area network transceiver circuitry that may handle 2.4 GHz and 5 GHz bands for WiFi® (IEEE 802.11) communications and that may handle the 2.4 GHz Bluetooth® communications band (or other wireless personal area network bands). Circuitry 34 may use cellular telephone transceiver circuitry 38 for handling wireless communications in frequency ranges such as a low communications band from 700 to 960 MHz, a midband from 1400 MHz or 1500 MHz to 2170 or 2200 MHz (e.g., a midband with a peak at 1700 MHz), and a high band from 2200 or 2300 to 2700 MHz (e.g., a high band with a peak at 2400 MHz) or other communications bands between 600 MHz and 4000 MHz or other suitable frequencies (as examples). Circuitry 38 may handle voice data and non-voice data.

Wireless communications circuitry 34 can include circuitry for other short-range and long-range wireless links if desired. For example, wireless communications circuitry 34 may include 60 GHz transceiver circuitry, circuitry for receiving television and radio signals, paging system transceivers, near field communications (NFC) transceiver circuitry 46 (e.g., an NFC transceiver operating at 13.56 MHz or another suitable frequency), etc. Wireless circuitry 34 may include satellite navigation system circuitry such as global positioning system (GPS) receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless circuitry 34 may include antennas 40. Antennas 40 may be formed using any suitable antenna types. For example, antennas 40 may include antennas with resonating elements that are formed from slot antenna structures, loop antenna structures, patch antenna structures, inverted-F antenna structures, planar inverted-F antenna structures, helical antenna structures, monopole antennas, dipole antenna structures, hybrids of these designs, etc. Different types of antennas may be used for different bands and combinations of bands. For example, one type of antenna may be used in forming a local wireless link antenna whereas another type of antenna is used in forming a remote wireless link antenna. If desired, space may be conserved within device 10 by using a single antenna to handle two or more different communications bands. For example, a single antenna 40 in device 10 may be used to handle communications in a WiFi® or Bluetooth® communication band at 2.4 GHz, a GPS communications band at 1575 MHz, a WiFi® or Bluetooth® communications band at 5.0 GHz, and one or more cellular telephone communications bands such as a cellular telephone midband between 1500 MHz and 2170 MHz.

It may therefore be desirable to implement antennas in device 10 using portions of electrical components that would otherwise not be used as antennas and that support additional device functions. As an example, it may be desirable to induce antenna currents in components such as display 14, so that display 14 and/or other electrical components (e.g., a touch sensor, near-field communications loop antenna, conductive display assembly or housing, conductive shielding structures, etc.) can serve as an antenna for Wi-Fi, Bluetooth, GPS, cellular frequencies, and/or other frequencies without the need to incorporate bulky antenna structures in device 10.

Figure 3:
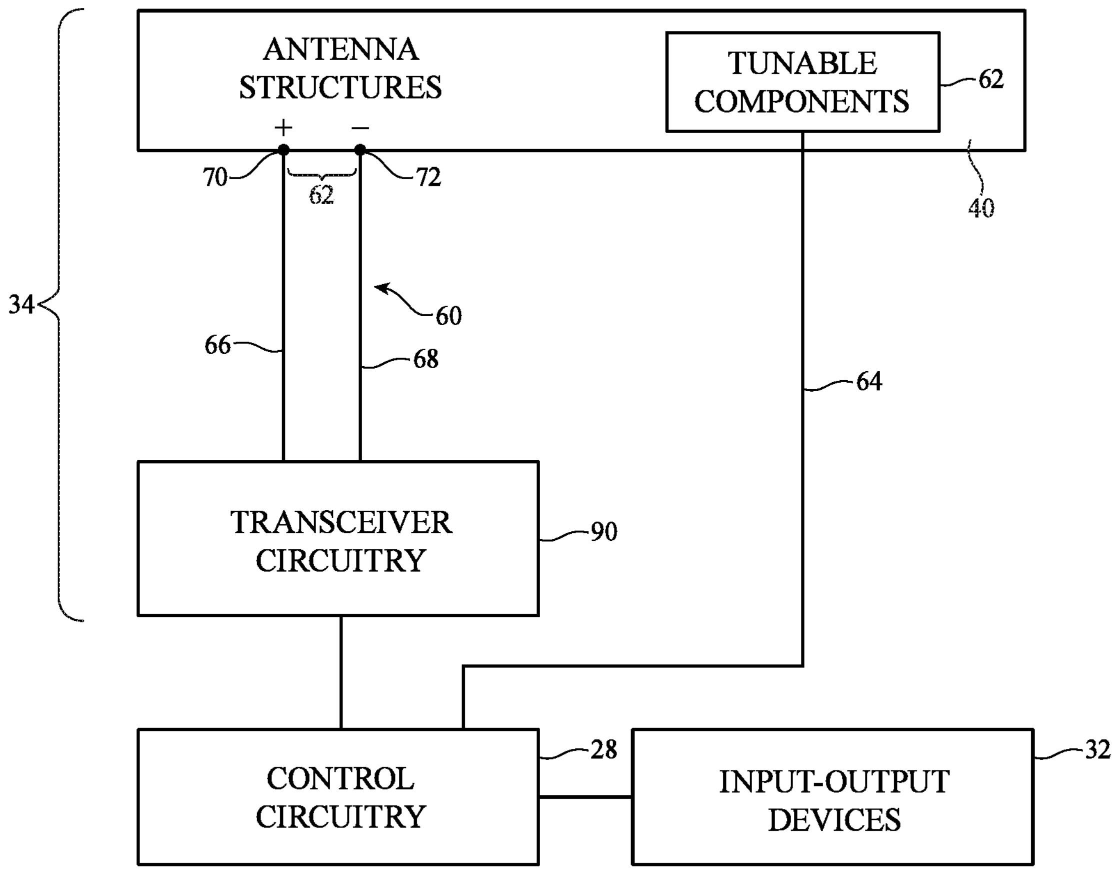
FIG. 3 is a diagram of illustrative wireless circuitry in an electronic device in accordance with an embodiment.

FIG. 3 is a diagram showing how transceiver circuitry 90 in wireless circuitry 34 may be coupled to antenna structures 40 using paths such as path 60. Wireless circuitry 34 may be coupled to control circuitry 28. Control circuitry 28 may be coupled to input-output devices 32. Input-output devices 32 may supply output from device 10 and may receive input from sources that are external to device 10.

To provide antenna structures 40 with the ability to cover communications frequencies of interest, antenna structures 40 may be provided with circuitry such as filter circuitry (e.g., one or more passive filters and/or one or more tunable filter circuits). Discrete components such as capacitors, inductors, and resistors may be incorporated into the filter circuitry. Capacitive structures, inductive structures, and resistive structures may also be formed from patterned metal structures (e.g., part of an antenna). If desired, antenna structures 40 may be provided with adjustable circuits such as tunable components 63 to tune antennas over communications bands of interest. Tunable components 63 may include tunable inductors, tunable capacitors, or other tunable components. Tunable components such as these may be based on switches and networks of fixed components, distributed metal structures that produce associated distributed capacitances and inductances, variable solid state devices for producing variable capacitance and inductance values, tunable filters, or other suitable tunable structures.

During operation of device 10, control circuitry 28 may issue control signals on one or more paths such as path 64 that adjust inductance values, capacitance values, or other parameters associated with tunable components 63, thereby tuning antenna structures 40 to cover desired communications bands.

Path 60 may include one or more radio-frequency transmission lines. As an example, signal path 60 of FIG. 3 may be a transmission line having first and second conductive paths such as paths 66 and 68, respectively. Path 66 may be a positive signal line and path 68 may be a ground signal line. Lines 66 and 68 may form parts of a coaxial cable, a stripline transmission line, and/or a microstrip transmission line (as examples). A matching network formed from components such as inductors, resistors, and capacitors may be used in matching the impedance of antenna structures 40 to the impedance of transmission line 60. Matching network components may be provided as discrete components (e.g., surface mount technology components) or may be formed from housing structures, printed circuit board structures, traces on plastic supports, etc. Matching network components may, for example, be interposed on line 60. The matching network components may be adjusted using control signals received from control circuitry 28 if desired. Components such as these may also be used in forming filter circuitry in antenna structures 40.

Transmission line 60 may be directly coupled to an antenna resonating element and ground for antenna 40 or may be coupled to near-field-coupled antenna feed structures that are used in indirectly feeding a resonating element for antenna 40. As an example, antenna structures 40 may form a slot antenna, an inverted-F antenna, a loop antenna, a patch antenna, or other antenna having an antenna feed 62 with a positive antenna feed terminal such as terminal 70 and a ground antenna feed terminal such as ground antenna feed terminal 72. Positive transmission line conductor 66 may be coupled to positive antenna feed terminal 70 and ground transmission line conductor 68 may be coupled to ground antenna feed terminal 72. If desired, antenna 40 may include an antenna resonating element that is indirectly fed using near-field coupling. In a near-field coupling arrangement, transmission line 60 is coupled to a near-field-coupled antenna feed structure that is used to indirectly feed antenna structures such as the antenna resonating element. This example is merely illustrative and, in general, any desired antenna feeding arrangement may be used.

Figure 4:
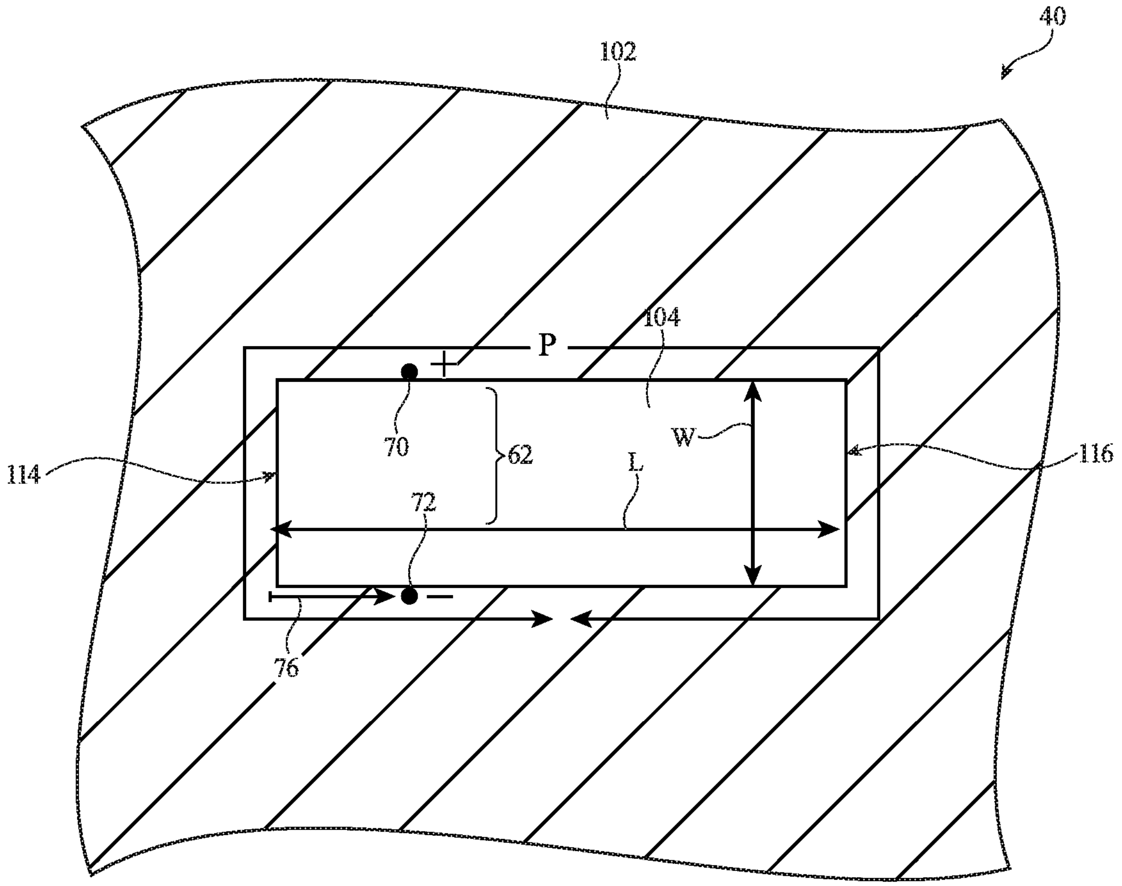
FIG. 4 is a schematic diagram of an illustrative slot antenna in accordance with an embodiment.

In one suitable arrangement, antenna 40 may be formed using a slot antenna structure. An illustrative slot antenna structure that may be used for forming antenna 40 is shown in FIG. 4. As shown in FIG. 4, slot antenna 40 may include a conductive structure such as structure 102 that has been provided with a dielectric opening such as dielectric opening 104. Openings such as opening 104 of FIG. 4 are sometimes referred to as slots, slot elements, or slot antenna resonating elements. In the configuration of FIG. 4, opening 104 is a closed slot, because portions of conductor 102 completely surround and enclose opening 104. Open slot antennas may also be formed in conductive materials such as conductor 102 (e.g., by forming an opening in the right-hand or left-hand end of conductor 102 so that opening 104 protrudes through conductor 102).

Antenna feed 62 for antenna 40 may be formed using positive antenna feed terminal 70 and ground antenna feed terminal 72. In general, the frequency response of an antenna is related to the size and shapes of the conductive structures in the antenna. Slot antennas of the type shown in FIG. 4 tend to exhibit response peaks when slot perimeter P is equal to the wavelength of operation of antenna 40 (e.g. where perimeter P is equal to two times length L plus two times width W). Antenna currents may flow between feed terminals 70 and 72 around perimeter P of slot 104. As an example, where slot length L>>slot width W, the length of antenna 40 will tend to be about half of the length of other types of antennas such as inverted-F antennas configured to handle signals at the same frequency. Given equal antenna volumes, slot antenna 40 will therefore be able to handle signals at approximately twice the frequency of other antennas such as inverted-F antennas, for example.

Feed 62 may be coupled across slot 104 at a location between opposing edges 114 and 116 of slot 104. For example, feed 62 may be located at a distance 76 from side 114 of slot 104. Distance 76 may be adjusted to match the impedance of antenna 40 to the impedance of transmission line 60 (FIG. 3). For example, the antenna current flowing around slot 104 may experience an impedance of zero at edges 114 and 116 of slot 104 (e.g., a short circuit impedance) and an infinite (open circuit) impedance at the center of slot 104 (e.g., at a fundamental frequency of the slot). Location 76 may be located between the center of slot 104 and edge 114 at a location where the antenna current experiences an impedance that matches the impedance of transmission line 60, for example (e.g., distance 76 may be between 0 and ¼ of the wavelength of operation of antenna 40).

The example of FIG. 4 is merely illustrative. In general, slot 104 may have any desired shape (e.g., where the perimeter P of slot 104 defines resonant characteristics of antenna 40). For example, slot 104 may have a meandering shape with different segments extending in different directions, may have straight and/or curved edges, etc. Conductive structures 102 may be formed from any desired conductive electronic device structures. For example, conductive structures 102 may include conductive traces on printed circuit boards or other substrates, sheet metal, metal foil, conductive structures associated with display 14 (FIG. 1), conductive portions of housing 12 (e.g., conductive walls 12W of FIG. 1), or other conductive structures within device 10. In one suitable arrangement, different sides (edges) of slot 104 may be defined by different conductive structures.

Figure 5:
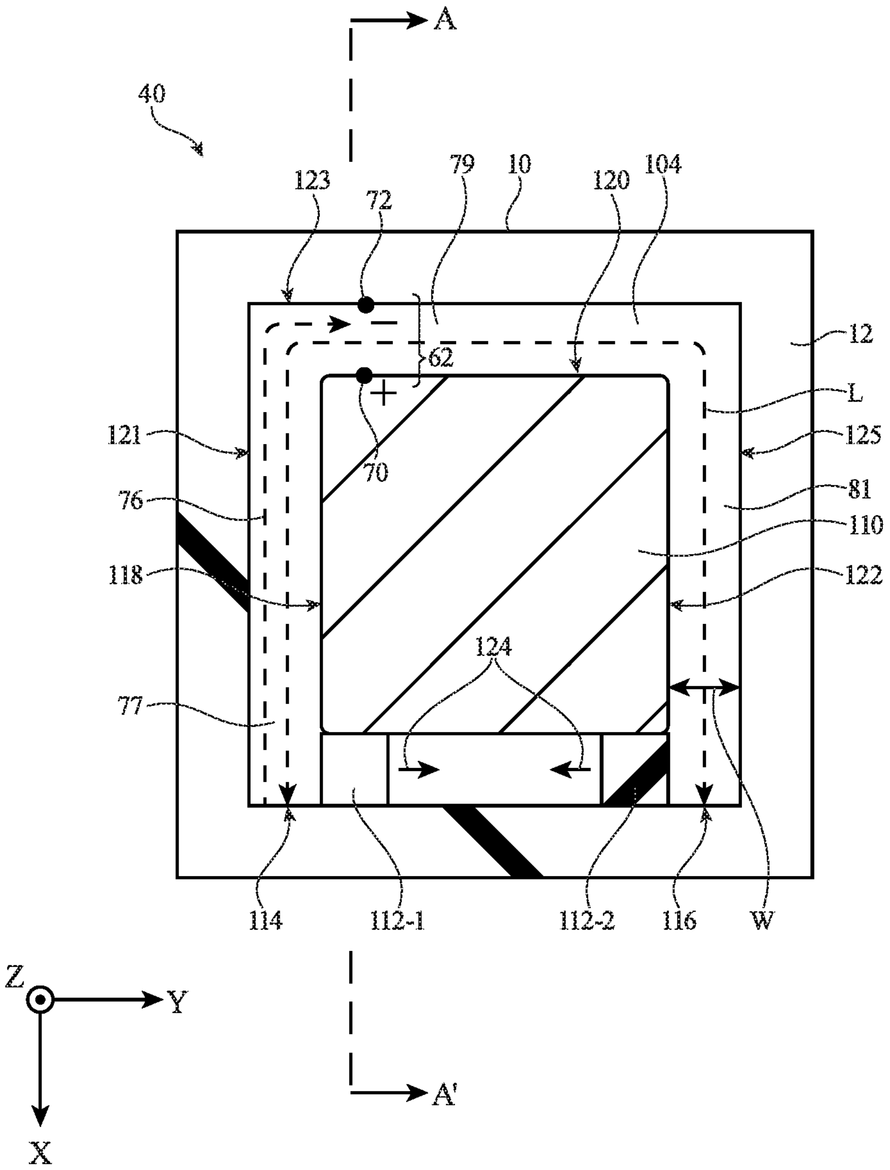
FIG. 5 is a top-down view an illustrative slot antenna formed using conductive display structures and conductive electronic device housing structures in accordance with an embodiment.

FIG. 5 is a top-down view showing how slot 104 may follow a meandering path and may have edges defined by different conductive electronic device structures. As shown in FIG. 5, slot 104 may have a first set of edges (e.g., outer edges 114, 121, 123, 125, and 116) defined by conductive housing structures 12 and a second set of edges (e.g., inner edges 118, 120, and 122) defined by conductive structures 110. Conductive structures 110 may, for example, include portions of display 14 (FIG. 1) such as metal portions of a frame or assembly of display 14, touch sensor electrodes within display 14, portions of a near field communications antenna embedded within display 14, ground plane structures within display 14, a metal back plate for display 14, or other conductive structures on or in display 14. Conductive structures 110 may sometimes be referred to herein as conductive display structures 110 or conductive display module structures 110. Conductive housing structures 12 may, for example, include conductive walls 12W located on different sides of device 10 (FIG. 1).

In the example of FIG. 5, slot 104 follows a meandering path and has a first segment 77 between edge 121 of housing 12 and edge 118 of conductive display structures 110, a second segment 79 between edge 123 of housing 12 and edge 120 of conductive display structures 110, and a third segment 81 between edge 125 of housing 12 and edge 122 of conductive display structures 110. Segments 77 and 81 may extend along parallel longitudinal axes. Segment 79 may extend between ends of segments 77 and 81 (e.g., along a longitudinal axis perpendicular to the longitudinal axes of segments 77 and 81). In this way, slot 104 may be an elongated slot that extends between conductive display structures 110 and conductive housing structures 12 (e.g., around two, three, or more than three sides of display structures 110).

Antenna feed 62 may have a ground feed terminal 72 coupled to housing 12 and a positive feed terminal 70 coupled to conductive display structures 110. Positive feed terminal 70 may be coupled to edge 118, edge 120, or edge 122 of conductive display structures 110, for example. In the example of FIG. 5, feed terminal 70 is coupled to edge 120 of structures 110. Feed 62 may be coupled across slot 104 at distance 76 from edge 114 of slot 104. When configured in this way, slot 104 may have length L defined by the cumulative lengths of segments 77, 79, and 81. The perimeter of slot 104 may be defined by the sum of the lengths of edges 121, 123, 125, 116, 122, 120, 118, and 114.

Antenna feed 62 may convey antenna currents around the perimeter of slot 104 (e.g., over conductive housing structures 12 and conductive display structures 110. The antenna currents may generate corresponding wireless signals that are transmitted by antenna 40 or may be generated in response to corresponding wireless signals received by antenna 40 from external equipment. The lengths of edges 121, 123, 125, 116, 122, 120, and 118 may be selected so that length L is approximately equal to one-half of the wavelength of operation of antenna 40, for example (e.g., an effective wavelength of operation of antenna 40 given dielectric loading conditions at slot 104).

One or more conductive interconnect paths 112 (e.g., first conductive interconnect path 112-1 and second conductive interconnect path 112-2) may define portions of the edges of slot 104 and may serve to effectively define the length L of slot 104. Conductive paths 112 may be held at a ground potential and/or may short conductive display structures 110 to housing 12. When configured in this way, antenna currents conveyed by feed 62 may experience a short circuit impedance perpendicular to edges 114 and 116, thereby serving to define a part of the perimeter of slot 104.

If desired, the location of conductive paths 112-1 and 112-2 may be adjusted (e.g., as shown by arrows 124) to extend the length L of slot 104 (e.g., so that slot 104 resonates at desired frequencies). In one suitable arrangement, length L is selected so that slot 104 covers a first frequency band (e.g., a first frequency band from 1.5 GHz to 2.4 GHz that covers WLAN, WPAN, satellite navigation communications, and/or a cellular midband frequencies) and a second frequency band defined by a harmonic mode of slot 104 (e.g., a second frequency band from 5.0 GHz to 6.0 GHz that covers WLAN communications frequencies). Conductive paths 112 may be directly connected to display structures 110, may be indirectly coupled to display structures 110 via capacitive coupling, or may be separated from display structures 110 (e.g., paths 112 need not be in contact with display structures 110 to electrically define part of the perimeter of slot 104).

In scenarios where interconnect paths 112 are absent from device 10, excessively strong electric fields may be generated between display structures 110 and housing 12 at the side of device 10 opposing feed 62. The presence of these fields may limit the overall antenna efficiency of antenna 40. However, the presence of interconnect paths 112 may effectively form a short circuit between structures 110 and housing 12. This may, for example, configure housing 12 and conductive display structures 110 to electrically behave as a single metal body, mitigating the excessive electric field at the side of device 10 opposing feed 62 and serving to increase antenna efficiency relative to scenarios where interconnect paths 112 are absent from device 10. The presence of interconnect paths 112 may allow for the width W of slot 104 and the thickness of device 10 to be reduced given equal antenna efficiencies relative to scenarios where interconnect paths 112 are not formed within device 10, for example.

Conductive interconnect paths 112 may include any desired conductive structures such as conductive adhesive (e.g., conductive tape), conductive fasteners (e.g., conductive screws or clips such as blade clips), conductive pins, solder, welds, conductive traces on flexible printed circuits, metal foil, stamped sheet metal, integral device housing structures, conductive brackets, conductive springs, and/or any other desired structures for defining the perimeter of slot 104 and/or effectively forming an electrical short circuit path between display structures 110 and housing 12.

In the example of FIG. 5, two conductive interconnect paths 112 are formed in device 10. This is merely illustrative. If desired, one, two, or more than two paths 112 may be used. Housing 12 and conductive display structures 110 may define width W of slot 104. Slot 104 may have a uniform width along length L or may have different widths along length L if desired. If desired, width W may be adjusted to tweak the bandwidth of antenna 40. As an example, width W may be between 0.5 mm and 1.0 mm. Slot 104 may have other shapes if desired (e.g., shapes with more than three segments extending along respective longitudinal axes, fewer than three segments, curved edges, etc.). If desired, one or more antenna tuning components (e.g., components 63 of FIG. 3) may be coupled across slot 104 or between two locations on one or more sides of slot 104 for adjusting the frequency response of slot 104 and thus antenna 40.

Figure 6:
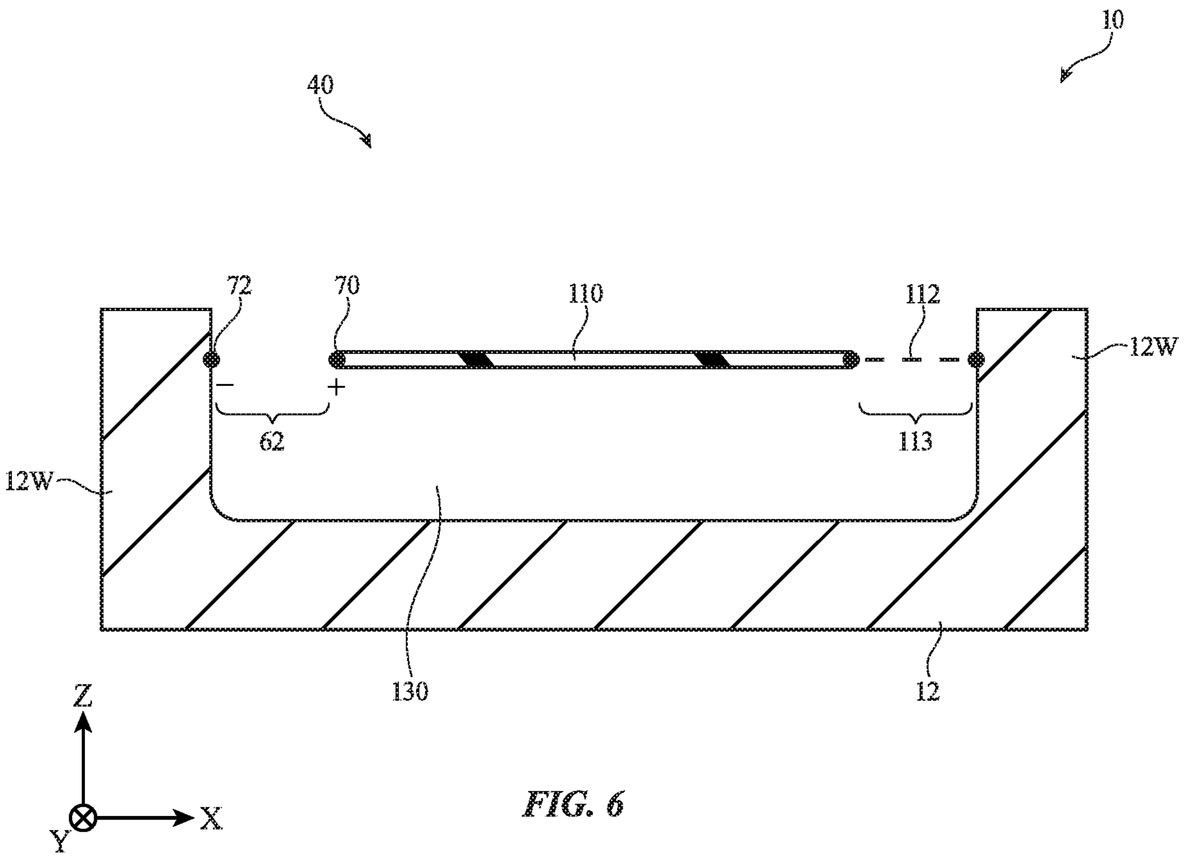
FIG. 6 is a cross-sectional side view of an illustrative slot antenna formed using conductive display structures and conductive electronic device housing structures in accordance with an embodiment.

FIG. 6 is a simplified cross-sectional side view of device 10 showing how antenna 40 may be formed from conductive display structures 110 and housing 12 (e.g., as taken along dashed line AA' of FIG. 5). As shown in FIG. 6, antenna 40 may include conductive display structures 110 coupled to an antenna feed such as feed 62. Feed 62 may have a positive antenna feed terminal such as positive antenna feed terminal 70 and a ground antenna feed terminal such as ground antenna feed terminal 72. Positive antenna feed terminal 70 may be coupled to conductive display structures 110. Ground antenna feed terminal 72 may be coupled to ground (e.g., to metal sidewalls 12W of housing 12 and other conductive structures around element 110 such as printed circuit structures). Housing 12 and conductive display structures 110 may define an interior cavity or volume 130. Additional device components may be mounted within volume 130 if desired. Feed 62 may be coupled to transceiver circuitry 90 by a transmission line such as a coaxial cable or a flexible printed circuit transmission line (e.g., transmission line 60 of FIG. 3).

Conductive display structures 110 may be coupled to ground (e.g., housing wall 12W) by interconnect path 112 (e.g., across gap 113 at the side of structures 110 opposing feed 62). Interconnect path 112 may include conductive structures that are directly connected to display structures 110, may include conductive structures that are capacitively coupled to (but not in contact with) display structures 110 (e.g., while still spanning gap 113 and electrically shorting display structures 110 to housing 12), and/or may include conductive structures that are not coupled to display structures 110 (e.g., while still spanning gap 113 and being held at a ground potential, thereby serving to electrically define the perimeter of slot 104 in the X-Y plane of FIG. 6). In the example of FIG. 6, conductive housing 12 defines a rear wall of device 10 that opposes conductive structures 110 (e.g., volume 130 may be defined by a rear wall of device 10). This is merely illustrative. If desired, some or all of the rear wall of device 10 may be formed from dielectric materials and volume 130 may be defined by other components such as one or more printed circuit boards within device 10.

Antenna 40 may be used to transmit and receive radio-frequency signals in WLAN and/or WPAN bands at 2.4 GHz and 5.0 GHz, in cellular telephone bands between 1.7 GHz and 2.2 GHz, in satellite navigation bands at 1.5 GHz, and/or other desired frequency bands. Additional antennas may also be provided in device 10 to handle these frequency bands and/or other frequency bands. The configuration for antenna 40 of FIG. 6 is merely illustrative.

Figure 7:
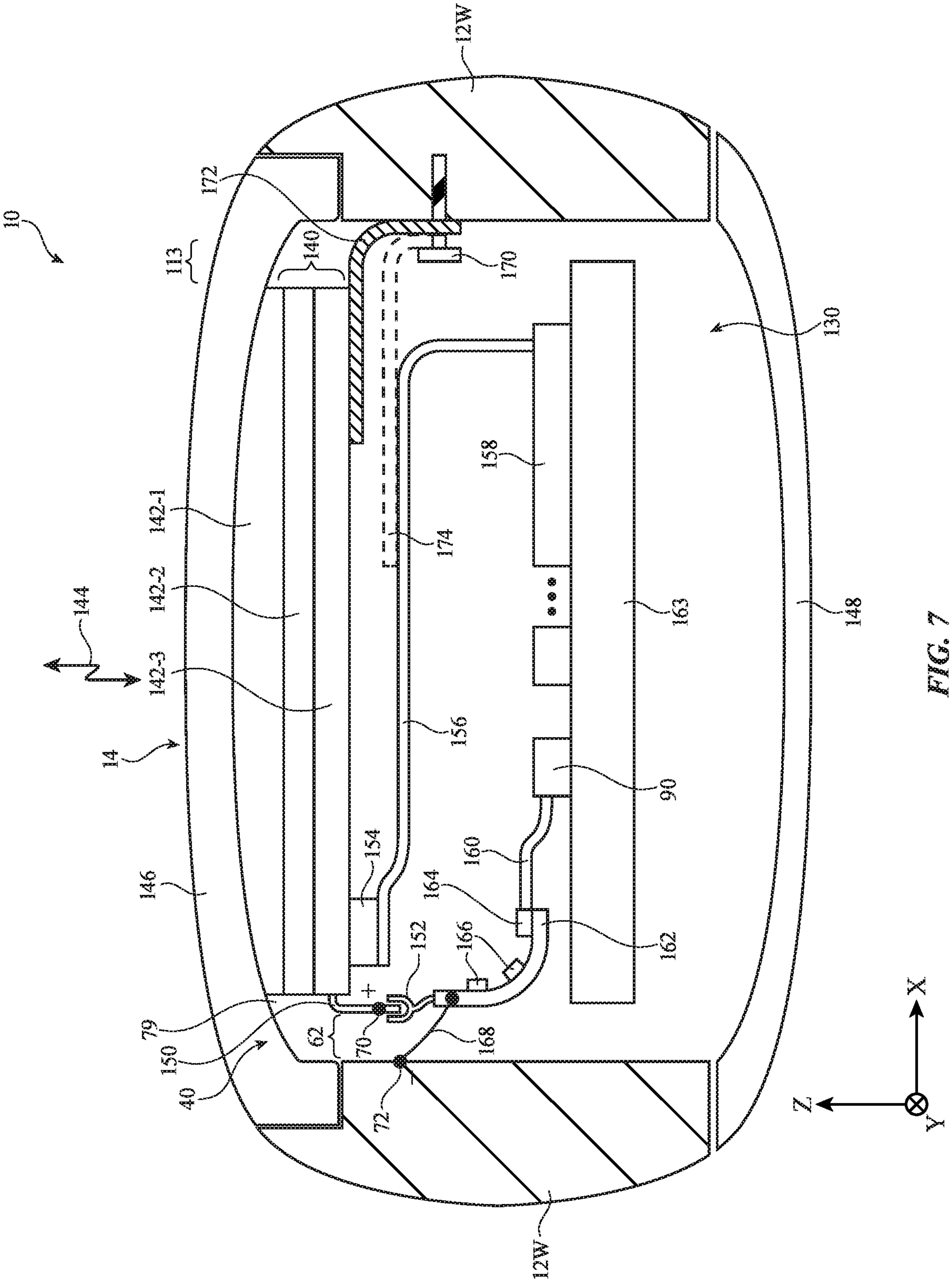
FIG. 7 is a cross-sectional side view of an illustrative electronic device having a slot antenna of the type shown in FIGS. 5 and 6 in accordance with an embodiment.

FIG. 7 is a cross-sectional side view of illustrative device 10 showing how conductive paths 112 may be implemented within antenna 40 (e.g., as taken along line AA' of FIG. 5). As shown in FIG. 7, device 10 may have conductive housing sidewall structures 12W that extend from the rear face to the front face of device 10. Housing 12 may include a dielectric rear housing wall such as housing wall 48. Display 14 may be formed at the front face of device 10 whereas dielectric rear housing wall 148 is formed at the rear face of device 10. Metal housing sidewalls 12W may be coupled to ground feed terminal 72 of antenna 40. Display 14 may include a display cover layer 146 and a display module 140 under cover layer 146.

Display module 140 may include conductive components that are used in forming conductive display structures 110 of slot antenna 40 (FIGS. 5 and 6). The conductive components in display module 140 may, for example, have planar shapes (e.g., planar rectangular shapes, planar circular shapes, etc.) and may be formed from metal and/or other conductive material that carries antenna currents. The thin planar shapes of these components and the stacked configuration of FIG. 7 may, for example, capacitively couple these components to each other so that they may operate together at radio frequencies to form conductive display structures 110 of FIGS. 5 and 6 (e.g., to effectively/electrically form a single conductor).

The components that form conductive display structures 110 may include, for example, planar components on one or more layers 142 (e.g., a first layer 142-1, a second layer 142-2, a third layer 142-3, or other desired layers). As one example, layer 142-1 may form a touch sensor for display 14, layer 142-2 may form a display panel (sometimes referred to as a display, display layer, or pixel array) for display 14, and layer 142-3 may form a near-field communications antenna for device 10 and/or other circuitry for supporting near-field communications (e.g., at 13.56 MHz). Touch sensor 142-1 may be a capacitive touch sensor and may be formed from a polyimide substrate or other flexible polymer layer with transparent capacitive touch sensor electrodes (e.g., indium tin oxide electrodes), for example. Display panel 142-2 may be an organic light-emitting diode display layer or other suitable display layer. Near-field communications layer 142-3 may be formed from a flexible layer that includes a magnetic shielding material (e.g., a ferrite layer or other magnetic shielding layer) and that includes loops of metal traces). If desired, a conductive back plate, metal shielding cans or layers, and/or a conductive display frame may be formed under and/or around layer 142-3 and may provide structural support and/or a grounding reference for the components of module 140. Module 140 may sometimes be referred to herein as display assembly 140.

Conductive material in layers 142-1, 142-2, 142-3, a conductive back plate for display 14, conductive shielding layers, conductive shielding cans, and/or a conductive frame for display 14 may be used in forming conductive structures 110 defining slot elements 104 (e.g., slot antenna resonating elements) of slot antenna 40. This and/or other conductive material in display 14 used to form conductive display structures 110 may be coupled together using conductive traces, vertical conductive interconnects or other conductive interconnects, and/or via capacitive coupling, for example.

Antenna 40 may be fed using antenna feed 62. Feed 62 may have a positive terminal such as terminal 70 that is coupled to display module 140 and therefore conductive display structures 110 (e.g., to near-field communications layer 142-3, display layer 142-2, touch layer 142-1, a metal back plate for module 140, and/or a metal display frame for module 140). Feed 62 may have a ground terminal such as terminal 72 that is coupled to an antenna ground in device 10 (e.g., metal housing wall 12W).

As shown in FIG. 7, device 10 may include printed circuit board structures such as printed circuit board 163. Printed circuit board 163 may be a rigid printed circuit board, a flexible printed circuit board, or may include both flexible and rigid printed circuit board structures. Printed circuit board 163 may sometimes be referred to herein as main logic board 163. Electrical components such as transceiver circuitry 90, interface circuitry such as display interface circuitry 158, and other components may be mounted to main logic board 163. If desired, one or more additional antennas, coil 50 (FIG. 2), and/or sensor circuitry or other input-output devices may be interposed between logic board 163 and dielectric rear housing wall 148 (e.g., for conveying wireless signals through wall 148). Antenna currents for slot antenna 40 may be conveyed around the perimeter of slot 104 (e.g., in the X-Y plane of FIG. 7) and corresponding radio-frequency signals may be conveyed through display cover layer 146, as shown by arrow 144.

Display module 140 may include one or more connectors 154. Connectors 154 may be coupled to one or more printed circuits 156. Printed circuits 156 may include flexible printed circuits (sometimes referred to herein as display flexes 156), rigid printed circuit boards, or traces on other substrates if desired. Connectors 154 may convey signals between layers 142 of display module 140 and display interface circuitry 158 on logic board 163 over display flexes 156.

As an example, display module 140 may include a first connector 154 that conveys near field communications signals to and/or from layer 142-1 over a first flex circuit 156, a second connector 154 that conveys display data (e.g., image data) from display interface 158 to display layer 142-2 over a second flex circuit 156 (e.g., layer 142-2 may emit light corresponding to the display data), and a third connector 154 may convey touch sensor signals from layer 142-1 to interface circuitry 158 over a third flex circuit 156. Connectors 154 may include conductive contact pads, conductive pins, conductive springs, conductive adhesive, conductive clips, solder, welds, conductive wires, and/or any other desired conductive interconnect structures and/or fasteners for conveying data associated with display module 140 between display module 140 and circuitry on logic board 163 or elsewhere in device 10.

Radio-frequency transceiver 90 may be coupled to feed 62 of antenna 40 over radio-frequency transmission line 60 (FIG. 4). Radio-frequency transmission line 60 may include conductive paths in flexible printed circuit 160 and dielectric support structure 162. Dielectric support structure may, for example, be formed from plastic or other dielectric materials. The conductive paths associated with radio-frequency transmission line 60 in printed circuit 160 may be coupled to the conductive paths associated with radio-frequency transmission line 60 in printed circuit 160 over radio-frequency connector 164.

Ground conductor 68 in transmission line 60 (FIG. 4) may be coupled to ground feed terminal 72 over path 168 (e.g., ground traces in substrate 162 may be coupled to terminal 72 over path 168). Path 168 may include a conductive wire, conductive adhesive, conductive fasteners such as screws, conductive pins, conductive clips, conductive brackets, solder, welds, and/or any other desired conductive interconnect structures. Signal conductor 66 of transmission line 60 (FIG. 4) may be coupled to feed terminal 70 of antenna 40 over conductive clip 152 (e.g., signal traces in substrate 162 may be coupled to terminal 70 over conductive clip 152).

If desired, a conductive tab or blade such as conductive tab 150 may be coupled to the conductive structures of display module 140 (e.g., conductive structures in layers 142, a conductive back plate, a conductive frame, conductive shielding cans or layers, and/or other conductive structures in module 140). Clip 152 may mate with tab 150 to form an electrical connection between transmission line 60 and feed terminal 70 (e.g., feed terminal 70 may be located on tab 150 when clip 152 is attached to tab 150). Clip 152 may, for example, be a tulip clip or other clip that has prongs or other structures that exerts pressure towards tab 150, thereby ensuring that a robust and reliable electrical connection is held between tab 150 and clip 152 over time.

When configured in this way, antenna currents may be conveyed over feed 62 and may begin to flow around the perimeter of slot 104 (e.g., in the X-Y plane of FIG. 7). In order to define the lateral length L of slot 104, conductive interconnect paths 112 may span gap 113 between a given side of module 140 and an adjacent sidewall 12W. In the example of FIG. 7, conductive interconnect paths 112 are implemented using conductive interconnect structures 172 and/or conductive interconnect structures 174.

As shown in FIG. 7, conductive interconnect structure 172 may be shorted to (e.g., in direct contact with) the conductive material in module 140 (e.g., conductive material within layer 142-1, layer 142-2, or layer 142-3, a conductive frame of module 140, a conductive back plate of module 140, shielding structures in module 140, and/or other conductive material in module 140 that are used to form conductive display structures 110 of antenna 40). For example, conductive adhesive or conductive fastening structures such as pins, springs, screws, clips, brackets, and/or other fastening structures may be used to ensure that interconnect 172 is held in contact with conductive material in display module 140. Interconnect 172 may extend across gap 113 and may be shorted to housing wall 12W. Interconnect 172 may be held into contact with housing wall 12W using conductive adhesive, pins, springs, screws, clips, brackets, and/or other structures if desired. In the example of FIG. 7, a conductive screw 170 fastens interconnect 172 to wall 12W and serves to electrically short interconnect 172 and conductive display structures 110 to wall 12W.

When configured in this way, conductive interconnect 172 may define a portion of the perimeter of slot 104 in antenna 40 (e.g., in the X-Y plane of FIG. 7 and as shown in FIG. 5), thereby partially defining length L of slot 104. In addition, interconnect 172 may form a short circuit between conductive material in module 140 (e.g., conductive structures 110 as shown in FIGS. 5 and 6) and housing sidewall 12W (e.g., antenna currents for antenna 40 may flow over interconnect 172 between module 140 and housing wall 12W). By shorting module 140 to wall 12W across gap 113, any excessively strong electric fields in region 113 may be mitigated, thereby optimizing antenna efficiency relative to scenarios where module 140 is completely isolated from walls 12W.

This example is merely illustrative. Interconnect paths 112 need not directly contact display module 140. In another suitable arrangement, interconnect paths 112 may span gap 113 without directly contacting display module 140 (e.g., as shown by conductive interconnect structures 174). In this scenario, interconnect structures 174 may be electrically shorted to one or more display flexes 156 (e.g., to ground conductors or other conductive material in display flexes 156). For example, interconnect structures 174 may be electrically shorted to display flexes 156 using conductive adhesive or conductive fastening structures such as pins, springs, screws, clips, brackets, and/or other structures that ensure that interconnect structures 174 are held in contact with display flexes 174. Interconnect 174 may extend across gap 113 and may be shorted to housing wall 12W using screw 170 or other fastening structures.

If desired, conductive interconnect structures 174 may be located sufficiently close to the conductive material in display module 140 so as to effectively short conductive display structures 110 to ground (e.g., at radio-frequencies handled by feed 62). For example, interconnect structures 174 may be capacitively coupled to conductive display structures 110 in display module 140 and antenna currents associated with antenna 40 may flow between display module 140 and housing wall 12W over interconnect 174 (e.g., via capacitive coupling). Conductive interconnect structures 174 need not be shorted to display flexes 156 in this scenario, if desired.

In another suitable arrangement, conductive interconnect structures 174 may be located far enough away from display module 140 so that interconnect structures 174 are not capacitively coupled to the conductive material in display module 140. In this scenario, because interconnect structure 174 is held at a ground potential (e.g., because interconnect structure 174 shorts ground structures in display flexes 156 to grounded housing wall 12W), interconnect structure 174 may electrically define edges of slot 104 despite not actually being in contact with or capacitively coupled to conductive display structures 110 in module 140, thereby defining length L of slot 104 (e.g., in the X-Y plane as shown in FIG. 5).

The example of FIG. 7 is merely illustrative. In general, housing sidewalls 12W, cover layer 146, and rear housing wall 148 may have any desired shapes. Additional components may be formed within volume 130 if desired. A substrate or other support structure may be interposed between logic board 163 and display flexes 156 if desired (e.g., to hold flexes 156 in place). Other arrangements may be used if desired. If desired, flexible printed circuit 160 may be coupled to feed 62 without plastic support 162 or flexible printed circuit 160 may be omitted (e.g., support 162 may be coupled directly to transceiver 90). Other transmission line and feeding structures may be used if desired.

Figure 8:
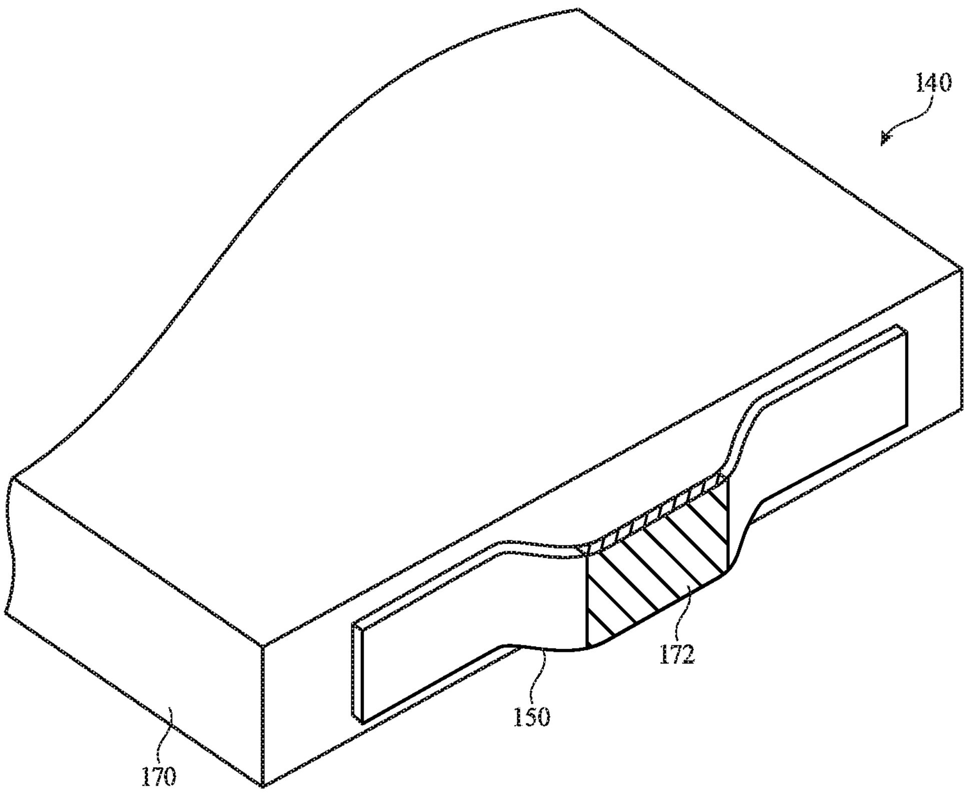
FIG. 8 is a perspective view of an illustrative conductive tab that may be used in coupling an antenna feed terminal to conductive display structures that are used in an antenna in accordance with an embodiment.

Tabs, clips, or other protruding portions of display module 140 such as tab 150 may serve as antenna feed terminal 70. Tab 150 may be received between flexible spring fingers such as metal prongs in clip 152. A rear perspective view of module 140 in an illustrative configuration in which tab 150 has been formed from a strip of metal is shown in FIG. 8. As shown in FIG. 8, display module 140 may include conductive structures 110 such as conductive structures in layers 142, a metal frame for module 140, a metal back plate for module, shielding structures, or other conductive structures. Tab 150 may be coupled to conductive structures 110. For example, tab 150 may be formed from an integral protrusion of conductive structures 110 or may be coupled to structures 110 using conductive adhesive, conductive screws, welds, solder, or other conductive fasteners. If desired, tab 150 may have a coating such as coating 172 (e.g., gold, nickel, or other metals) to facilitate satisfactory ohmic contact between tab 150 and the prongs of clip 152 (FIG. 7) when the coated surface of portion 172 is received between the prongs of clip 152.

Figure 9:
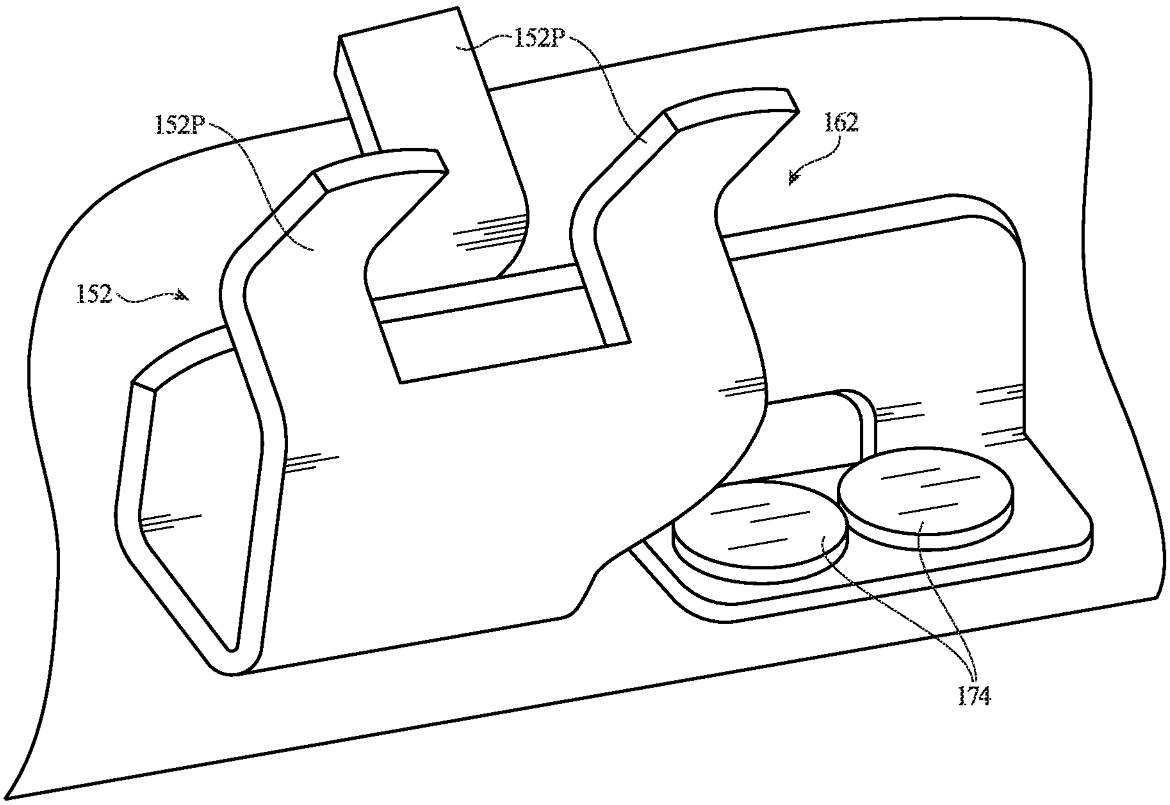
FIG. 9 is a perspective view of an illustrative set of spring fingers that may be used to couple a positive antenna feed terminal to the conductive tab of FIG. 8 in accordance with an embodiment.

A perspective view of clip 152 in an illustrative configuration in which clip 152 is secured using fasteners such as screws 174 is shown in FIG. 9. As shown in FIG. 9, clip 152 may be mounted on a plastic support structure 162 (FIG. 7) or other suitable support structures. Metal traces on structure 162 may route positive antenna feed signals to clip 152. Clip 152 may include prongs 152P that mechanically hold tab 150 in place and that electrically couple the metal traces on structure 162 to feed terminal 70. If desired, impedance matching circuitry and other circuitry may be mounted on support structure 162. The example of FIG. 9 is merely illustrative and, if desired, other conductive fastening mechanisms may be used to secure transmission line 60 to feed terminal 70.

Figure 10:
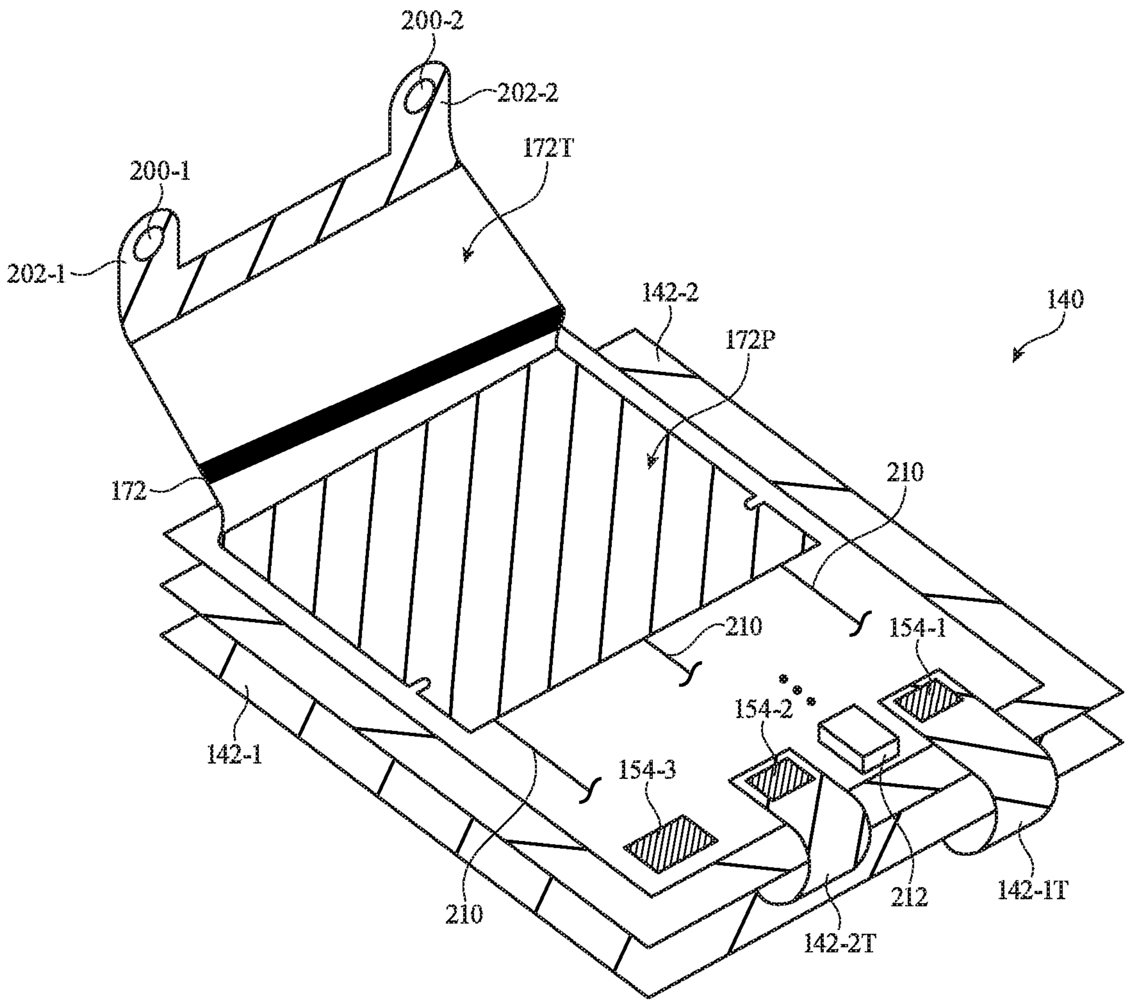
FIG. 10 is a rear perspective view of illustrative display structures that may be used in forming a part of a slot antenna and that may be shorted to conductive device housing structures in accordance with an embodiment.

A rear perspective view of illustrative electrical components that may be stacked under display cover layer 146 and that may form antenna conductor 110 of antenna 40 is shown in FIG. 10. As shown in FIG. 10, display module 140 may include touch sensor layer 142-1, display layer 142-2, and near-field communications antenna layer 142-3. Layer 142-1, layer 142-2, and layer 142-3 are stacked next to each other and may therefore be capacitively coupled to each other, if desired. This may, for example, allow layers 142 to operate together as conductive display structures 110 of antenna 40 at radio frequencies (e.g., at WLAN, WPAN, satellite navigation, and cellular telephone frequencies).

Layer 142-1, layer 142-2, and layer 142-3 may be interconnected with other components in device 10 such as display module interface circuitry 158 (FIG. 7) using connectors 154 (e.g., a first connector 154-1 coupled to layer 142-1, a second connector 154-2 coupled to layer 142-2, and a third connector 152-3 coupled to layer 142-3). Connectors 154 may be mounted on the underside of layer 142-3, on tail 142-2T of layer 142-2, on tail 142-1T of layer 142-1, and/or on other suitable structures. Layers 142 need not have tails if desired.

Components 212 may be mounted to layer 142-1, 142-2, and/or 142-3. Components 212 may, for example, include near-field communications circuitry, touch sensor processing circuitry, and/or display driver circuitry. Other types of components may be mounted in the stack of module 140 if desired. For example, a force sensor layer may be included in module 140. As another example, the functions of two or more of these layers may be consolidated. For example, capacitive touch sensor electrodes for a capacitive touch sensor may be formed from metal traces on organic light-emitting diode display layer 142-2 and a separate touch sensor layer 142-1 may be omitted. Near-field communications antenna layer 142-3 may also be omitted (e.g., in a configuration for device 10 without near-field communications circuitry and/or in a configuration for device 10 in which the near-field communications antenna is located in a different portion of housing 12). The configuration of display module 140 of FIG. 10 is illustrative.

As shown in FIG. 10, conductive interconnect structure 172 may be shorted to conductive structures such as conductive structures 210 of display module 140. Conductive structures 210 may include conductive traces on layers 142, conductive contact pads, conductive electrodes on layers 142, portions of a conductive frame or back plate for module 140, shielding structures in module 140, NFC antenna structures, pixel circuitry, ground lines in module 140, or any other desired conductive structures (e.g., structures coupled to feed terminal 70 and that include some or all of conductive display structures 110).

Conductive interconnect structure 172 may include a first region (portion) 172P that is coupled to conductive structures 210 on module 140 and a second (tail) region 172T. Region 172P may be secured to layer 142-3 or other portions of module 140 using conductive adhesive, conductive screws, conductive springs (e.g., conductive springs that exert a force on region 172P towards layer 142-3), or any other desired conductive fastening structures. Conductive interconnect structure 172 may include conductive traces on a flexible printed circuit, stamped sheet metal, metal foil, a layer of conductive adhesive, a conductive layer having adhesive and non-adhesive portions, combinations of these, or any other desired conductive structures or layers.

When display 14 is assembled on housing 12, tail region 172T may extend across gap 113 (FIG. 7). Tail region 172T may include one or more brackets or tabs 202 having corresponding holes 200 (e.g., a first tab 202-1 having a first hole 200-1 and a second tab 202-2 having a second hole 200-2). Tabs 202 may be secured to housing wall 12W. Tabs 202 may be held in place by screws 170 (FIG. 7) or other conductive fasteners to maintain a reliable mechanical and electrical connection between tabs 202 and housing wall 12W. In this way, conductive display structures 110 may be shorted to housing wall 12W across gap 113 using interconnect structure 172, thereby defining the dimensions of slot element 104. The example of FIG. 10 is merely illustrative. If desired, holes 200 may be omitted. If desired, tail 172T may include a single continuous conductor extending across any desired length of housing wall 12W.

Figure 11:
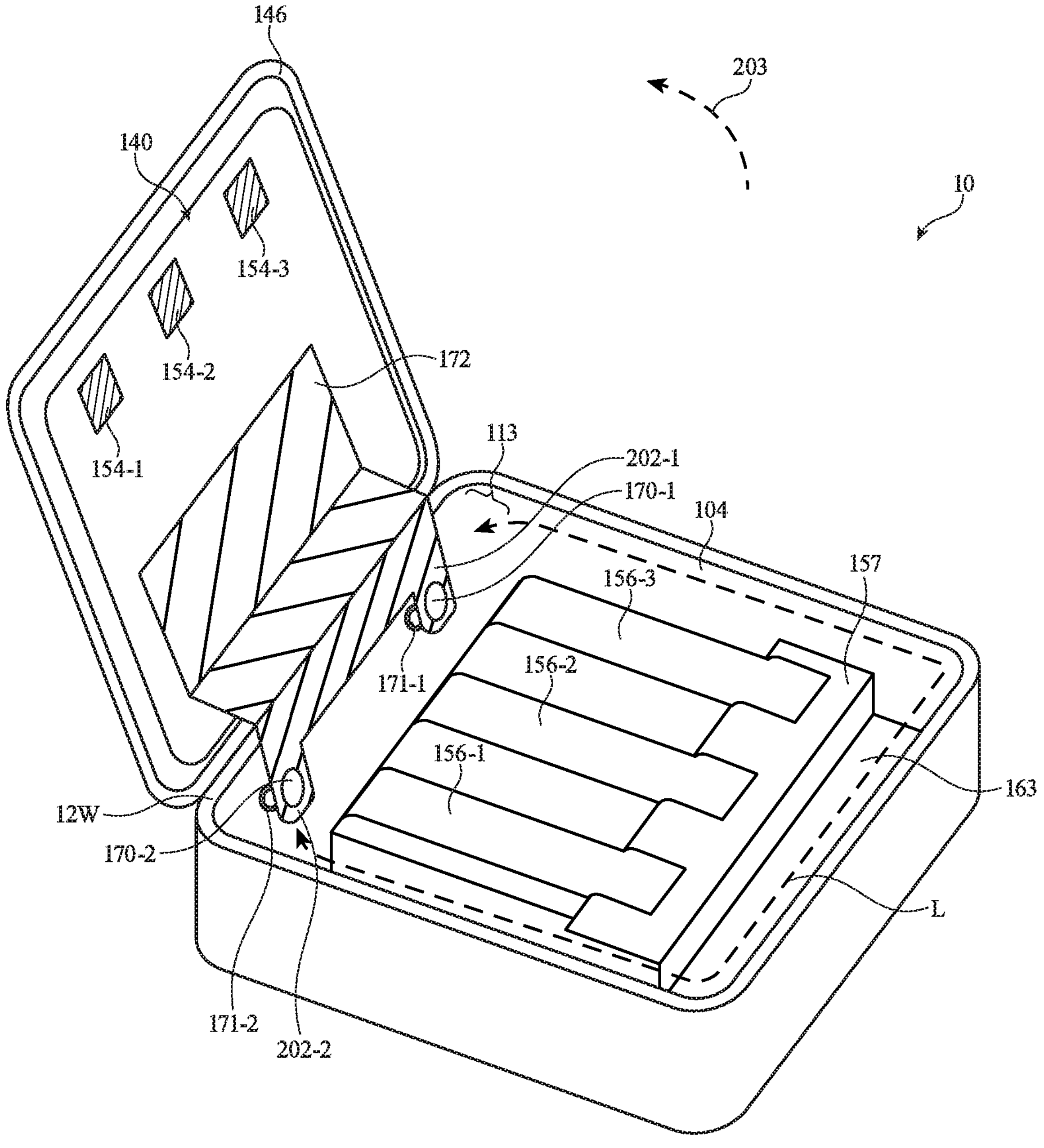
FIG. 11 is a front perspective view of an illustrative electronic device having conductive display structures that are used in forming a part of a slot antenna and that are shorted to conductive device housing structures in accordance with an embodiment.

FIG. 11 is a perspective front view of device 10 showing how conductive interconnect 172 may be coupled between housing wall 12W and display module 140. In the perspective view of FIG. 11, display cover layer 146 and display module 140 have been removed from device 10 (e.g., one end of display 14 has been rotated upwards off of housing sidewalls 12W as shown by arrow 203) to expose the components within device 10. When device 10 is fully assembled, display 14 may be mounted onto sidewalls 12W so that the bottom of cover layer 146 lies flush with the top edges of sidewalls 12W.

As shown in FIG. 11, multiple display flex circuits 156 may be formed over logic board 163 (e.g., a first flex 156-1, a second flex 156-2, and a third flex 156-3). If desired, flexes 156-1, 156-2, and 156-3 may be mounted on a support structure such as support structure 157 on logic board 163. When display 14 is closed onto housing walls 12W, display flex 156-3 may be electrically coupled to connector 154-3 on display module 140, display flex 156-2 may be electrically coupled to connector 154-2 on display module 140, and display flex 156-1 may be electrically coupled to connector 154-1 on display module 140. Display flex 156-3 and connector 154-3 may, for example, convey near field communications signals between layer 142-3 on module 140 and other communications circuitry on logic board 163 such as a near field transceiver on logic board 163 (e.g., via interface circuitry on board 163 such as interface 158). Display flex 156-2 and connector 154-2 may, for example, convey image data between layer 142-2 on module 140 and display circuitry on logic board 163 (e.g., via display interface 158 on board 163). Display flex 156-1 and connector 154-1 may, for example, convey touch sensor data between layer 142-1 on module 140 and control circuitry on logic board 163 (e.g., via display interface 158 on board 163).

Tab 202-1 of conductive interconnect structure 172 may be secured to housing wall 12W using conductive screw 170-1 and/or other conductive fastening structures. If desired, screw 170-1 may be received by a mating threaded hole 171-1 in housing wall 12W. Tab 202-2 of conductive interconnect structure 172 may be secured to housing wall 12W using conductive screw 170-2 and/or other conductive fastening structures. If desired, screw 170-1 may be received by a mating threaded hole 171-2 in housing wall 12W. Conductive interconnect 172 may short conductive structures in display module 140 to housing sidewall 12W over tabs 202 and screws 170. When display 14 is closed over sidewalls 12W, conductive interconnect 172 may bridge gap 113 to define the length L of slot element 104.

Figure 12:
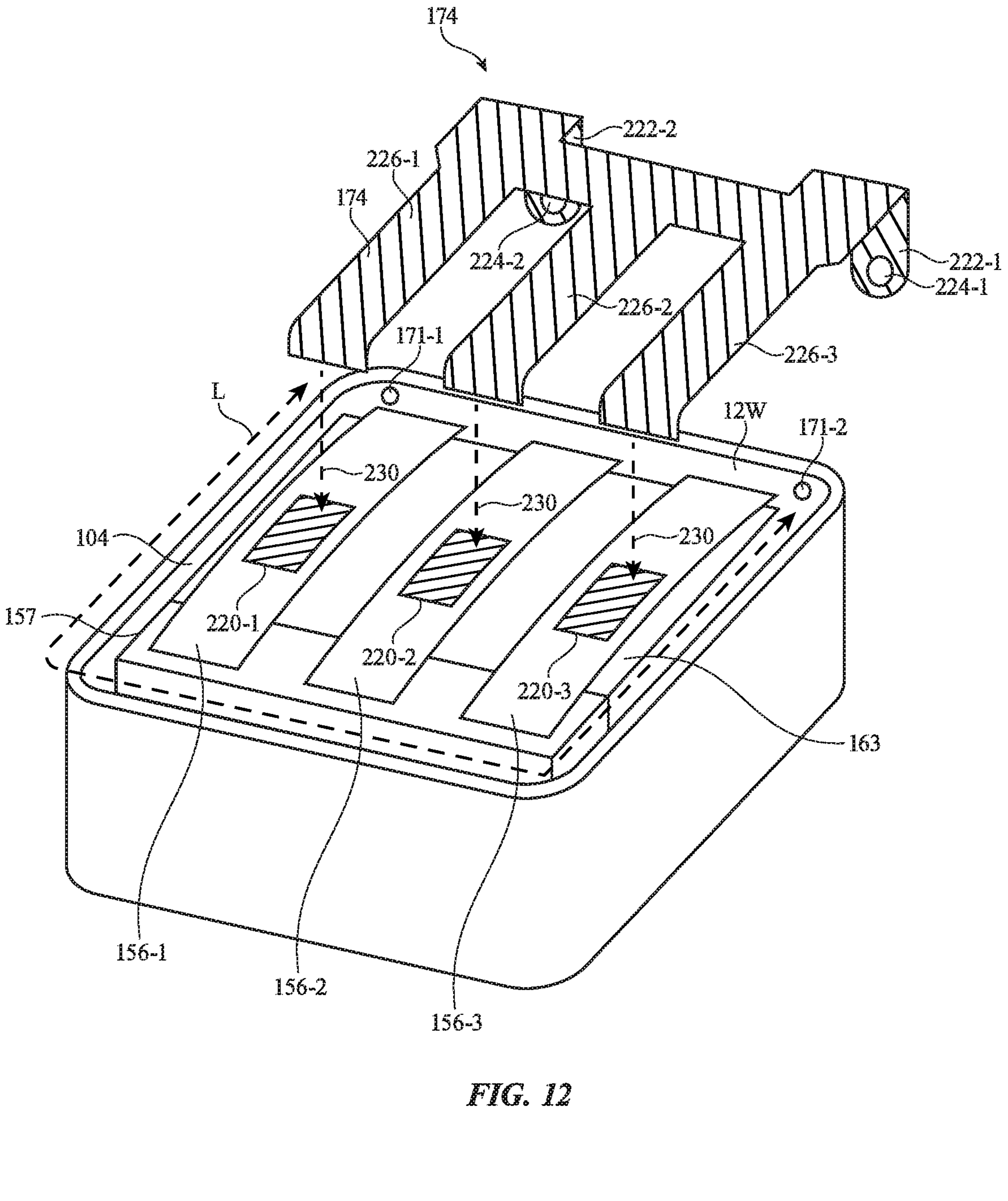
FIG. 12 is a perspective view of an illustrative electronic device having conductive interconnect structures that short display circuit boards to conductive device housing structures in accordance with an embodiment.

FIG. 12 is a perspective front view of device 10 showing how conductive interconnect 174 (FIG. 7) may be coupled between housing wall 12W and display flexes 156. Conductive interconnect 174 may be formed within device 10 in addition to or instead of conductive interconnect 172 of FIGS. 10 and 11. In the perspective view of FIG. 12, display cover layer 146 and display module 140 (i.e., display 14) are not shown for the sake of clarity.

As shown in FIG. 12, display flex circuits 156 may have conductive regions 220. Conductive regions 220 may, for example, include ground traces or other grounded portions of flex circuits 156. For example, flex circuit 156-1 may have a first conductive region 220-1, flex circuit 156-2 may have a second conductive region 220-2, and flex circuit 156-3 may have a third conductive region 220-3. Conductive interconnect structure 174 may include tabs or brackets 222 each having a corresponding hole 224 (e.g., a first tab 222-1 having a first hole 224-1 and a second tab 222-2 having a second hole 224-2).

Conductive interconnect structure 174 may include one or more branches 226. For example, conductive interconnect structure 174 may include a first branch 226-1, a second branch 226-2, and a third branch 226-3. While the use of different branches may reduce the amount of space required to form interconnect structure 174 in device 10, in another suitable arrangement, each of the branches may be formed as a part of a single continuous (e.g., planar) conductor.

When device 10 is fully assembled, conductive interconnect structure 174 may be lowered towards logic board 163 as shown by arrows 230. This may place branch 226-1 into contact with conductive region 220-1, may place branch 226-2 into contact with conductive region 220-2, and may place branch 226-3 into contact with conductive region 220-3 on flex circuits 156. If desired, conductive adhesive, conductive screws, solder, welds, clips, or other conductive fastening structures may be used to secure branches 226 to corresponding conductive regions 220 when interconnect structure 174 is lowered onto device 10. Tab 224-1 may be secured to housing wall 12W via a first screw 170 extending through opening 224-1 and mating with threaded hole 171-2 in housing wall 12W. Tab 224-2 may be secured to housing wall 12W via a second screw 170 extending through opening 224-2 and mating with threaded hole 171-1 in housing wall 12W. This is merely illustrative and, if desired, other conductive fasteners may be used. One or more than two tabs 224 may be used to secure interconnect structure 174 to housing wall 12W.

In this way, when fully assembled, conductive interconnect structure 170 may short grounded regions 220 on display flexes 156 to housing wall 12W. This may serve to electrically define at least some of the boundaries of slot element 104 (e.g., length L of slot element 104). If desired, branches 226 may be capacitively coupled to conductive structures in display module 140. In this scenario, branches 226 may short antenna currents flowing through display module 140 (e.g., conductive display structures 110) to housing sidewall 12W via capacitive coupling. Branches 226 need not be coupled to regions 220 on flexes 156 in this scenario if desired.

The example of FIGS. 5-12 in which positive antenna feed terminal 70 is coupled to display structures 110 and ground antenna feed terminal 72 is coupled to housing 12 is merely illustrative. If desired, positive antenna feed terminal 70 may be coupled to housing 12 whereas ground antenna feed terminal 72 may be coupled to display structures 110 (e.g., where the locations of feed terminals 72 and 70 in FIGS. 5-7 are swapped).

Figure 13:
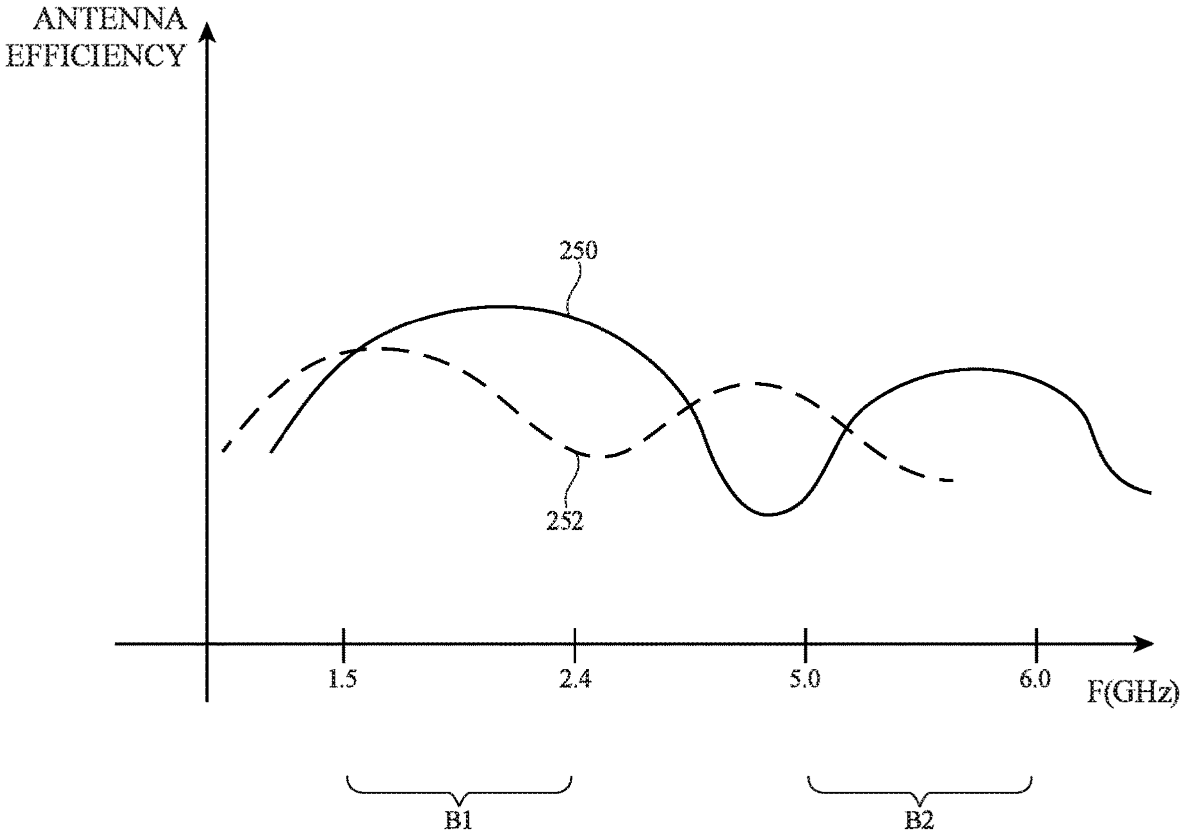
FIG. 13 is a graph of antenna performance (antenna efficiency) for illustrative antenna structures of the types shown in FIGS. 5-12 in accordance with an embodiment.

FIG. 13 is a graph in which antenna performance (antenna efficiency) has been plotted as a function of operating frequency f for antennas 40 of FIGS. 5-12. As shown in FIG. 13, curve 252 plots the antenna efficiency of antenna 40 in the absence of conductive interconnect paths 112 (e.g., interconnect structures 172 as shown in FIGS. 10 and 11 or interconnect structures 174 as shown in FIG. 12). It may be desirable to cover a lower frequency band B1 and a higher frequency band B2 using antenna 40 (e.g., a first frequency band B1 between 1.5 GHz and 2.4 GHz and a second frequency band B2 between 5.0 GHz and 6.0 GHz). Covering bands B1 and B2 may, for example, allow antenna 40 to cover WLAN and WPAN frequencies at 2.4 GHz and 5.0 GHz, cellular midband frequencies between 1.7 GHz and 2.2 GHz, and/or satellite navigation frequencies at 1.5 GHz, for example. Curve 252 may exhibit efficiency peaks outside of bands of interest B1 and B2. When configured in this way, antenna 40 may have unsatisfactory efficiency within bands B1 and B2.

Curve 250 plots the antenna efficiency of antenna 40 when slot antenna 40 has a length L defined at least in part by conductive interconnect paths 112 (e.g., interconnect structures 172 as shown in FIGS. 10 and 11 and/or interconnect structures 174 as shown in FIG. 12). When configured in this way, antenna 40 may exhibit efficiency peaks in bands B1 and B2. For example, coverage in band B1 may be supported by a fundamental mode of slot 104 (e.g., where length L is approximately equal to half of the wavelength of operation given the dielectric loading conditions of slot 104). Coverage in band B2 may, for example, be supported by a harmonic mode of slot 104. When configured in this way, antenna 40 may exhibit satisfactory efficiency within bands B1 and B2 and may therefore concurrently cover WLAN and WPAN frequencies at 2.4 GHz and 5.0 GHz, cellular midband frequencies between 1.7 GHz and 2.2 GHz, and/or satellite navigation frequencies at 1.5 GHz if desired.

The example of FIG. 14 is merely illustrative. In general, efficiency curve 250 may have any desired shape. Curve 250 may exhibit peaks in efficiency in more than two frequency bands, in fewer than two frequency bands, or in any other desired frequency bands if desired.

The foregoing is merely illustrative and various modifications can be made to the described embodiments. The foregoing embodiments may be implemented individually or in any combination.

What is claimed is:

1. An electronic device comprising:

peripheral conductive housing structures;

a display mounted to the peripheral conductive housing structures, wherein the display comprises a display cover layer and a display module that emits image light through the display cover layer;

a conductive interconnect structure that electrically shorts a conductive structure in the display module to the peripheral conductive housing structure;

a slot that extends between at least two sides of the display module and the peripheral conductive housing structures, wherein the slot has edges defined by the conductive interconnect structure, the peripheral conductive housing structures, and the at least two sides of the display module; and an antenna feed having a first feed terminal coupled to the peripheral conductive structures and a second feed terminal coupled to the display module, wherein the antenna feed is configured to feed antenna currents that flow along the display module, the conductive interconnect structure, and the peripheral conductive housing structures.

2. The electronic device defined in claim 1, further comprising a screw that secures the conductive interconnect structure to the peripheral conductive housing structures.

3. The electronic device defined in claim 2, further comprising an additional screw that secures the conductive interconnect structure to the peripheral conductive housing structures.

4. The electronic device defined in claim 1, wherein the conductive interconnect structure defines first and second opposing ends of the slot, the slot having a length extending from the first end to the second end that, and the length being selected to configure the slot to resonate in a frequency band.

5. The electronic device defined in claim 4, wherein the frequency band comprises a frequency between 1.5 GHz and 6.0 GHz.

6. The electronic device defined in claim 4, wherein the peripheral conductive housing structures comprise first, second, third and fourth sidewalls for the electronic device, the third sidewall opposes the first sidewall, the fourth sidewall opposes the second sidewall, and the second and fourth sidewalls extend from the first sidewall to the third sidewall, the slot comprising a first segment extending between the first sidewall and a first side of the at least two sides of the display module, and the slot comprising a second segment extending between the second sidewall and a second side of the at least two sides of the display module.

7. The electronic device defined in claim 6, wherein the slot further comprises a third segment extending between the third sidewall and a third side of the display module, the second segment extending from the first segment to the third segment.

8. The electronic device defined in claim 7, wherein the conductive interconnect structure electrically shorts the conductive structure in the display module to the fourth sidewall.

9. The electronic device defined in claim 4, wherein the conductive interconnect structure has a first branch that defines the first end of the slot and has a second branch that defines the second end of the slot.

10. An electronic device comprising:

first, second, third, and fourth conductive sidewalls, wherein the third conductive sidewall opposes the first conductive sidewall, the fourth conductive sidewall opposes the second conductive sidewall, and the second and fourth conductive sidewalls extend from the first conductive sidewall to the third conductive sidewall;

a display having a display cover layer mounted to the first, second, third, and fourth conductive sidewalls, wherein the display comprises a display module configured to emit light through the display cover layer;

a slot having a first segment extending between the first conductive sidewall and a first edge of the display module, a second segment extending between the second conductive sidewall and a second edge of the display module, and a third segment extending between the third conductive sidewall and a third edge of the display module, wherein the second segment extends from the first segment to the third segment;

an antenna feed coupled across the slot and configured to convey antenna currents that flow along a perimeter of the slot; and a conductive interconnect structure that couples the display module to the fourth conductive sidewall and that forms at least part of the perimeter of the slot.

11. The electronic device defined in claim 10, wherein the antenna feed is coupled to the second conductive sidewall and the second edge of the display module.

12. The electronic device defined in claim 11, further comprising a conductive fastening structure that attaches the conductive interconnect structure to the fourth conductive sidewall.

13. The electronic device defined in claim 10, further comprising:

display module interface circuitry; and a flexible printed circuit that couples the display module interface circuitry to the display module.

14. The electronic device defined in claim 13, wherein the conductive interconnect structure is shorted to a ground trace on the flexible printed circuit.

15. The electronic device defined in claim 10, wherein the conductive interconnect structure defines opposing first and second ends of the slot, the slot having a length from the first end to the second end that is selected to configure the slot to resonate in a frequency band.

16. The electronic device defined in claim 15, wherein the conductive interconnect structure is capacitively coupled to a conductive structure in the display module and forms a short circuit path to the fourth conductive sidewall at frequencies in the frequency band.

17. The electronic device defined in claim 10, wherein the conductive interconnect structure is shorted to a conductive structure in the display module.

18. An electronic device comprising:

a display having a display cover layer and a display module configured to emit light through the display cover layer, wherein the display module has first, second, third, and fourth edges, the third edge opposes the first edge, and the fourth edge opposes the second edge;

peripheral conductive housing structures that run around the first, second, third, and fourth edges of the display module;

a slot having edges defined by the first, second, third, and fourth edges of the display module and the peripheral conductive housing structures;

an antenna feed coupled between the first edge and the peripheral conductive housing structures across the slot; and a grounded conductive interconnect structure coupled between the third edge of the display module and the peripheral conductive housing structures across the slot.

19. The electronic device defined in claim 18, wherein the grounded conductive interconnect structure is configured to mitigate an electric field produced by the antenna feed at the third edge of the display module.

20. The electronic device defined in claim 19, further comprising:

display module interface circuitry; and a flexible printed circuit that couples the display module interface circuitry to the display module, wherein the grounded conductive interconnect structure is shorted to a ground trace on the flexible printed circuit.

* * * * *